(12) United States Patent
Hunt et al.

(10) Patent No.: US 8,738,337 B2
(45) Date of Patent: May 27, 2014

(54) METHODS FOR ACCURATE USE OF FINITE DYNAMIC RANGE MEASUREMENT DATA IN RADIO PATH LOSS PROPAGATION MODEL CALIBRATION

(75) Inventors: Nathan Hunt, Berkeley, CA (US); Marc Bensadoun, Berkeley, CA (US)

(73) Assignee: Newfield Wireless, Berkeley, CA (US)

( * ) Notice: Subject to any disclaimer, the term of this patent is extended or adjusted under 35 U.S.C. 154(b) by 0 days.

(21) Appl. No.: 13/564,991

(22) Filed: Aug. 2, 2012

(65) Prior Publication Data

US 2014/0066078 A1 Mar. 6, 2014

Related U.S. Application Data

(63) Continuation of application No. 13/012,651, filed on Jan. 24, 2011, which is a continuation of application No. 12/633,113, filed on Dec. 8, 2009, now abandoned, which is a continuation of application No. 11/372,154, filed on Mar. 9, 2006, now abandoned.

(60) Provisional application No. 60/661,128, filed on Mar. 11, 2005.

(51) Int. Cl.
*G06F 17/50* (2006.01)
*G06F 13/10* (2006.01)
*G06F 11/26* (2006.01)

(52) U.S. Cl.
CPC ............ *G06F 13/105* (2013.01); *G06F 11/261* (2013.01); *G06F 17/50* (2013.01)
USPC ............................................................ 703/2

(58) Field of Classification Search
None
See application file for complete search history.

(56) References Cited

U.S. PATENT DOCUMENTS

| 6,204,812 | B1 * | 3/2001 | Fattouche | 342/457 |
| 6,208,295 | B1 * | 3/2001 | Dogan et al. | 342/378 |
| 6,208,297 | B1 * | 3/2001 | Fattouche et al. | 342/450 |
| 6,215,983 | B1 * | 4/2001 | Dogan et al. | 455/63.1 |
| 6,236,365 | B1 * | 5/2001 | LeBlanc et al. | 342/457 |
| 6,266,014 | B1 * | 7/2001 | Fattouche et al. | 342/450 |
| 6,285,321 | B1 * | 9/2001 | Stilp et al. | 342/465 |
| 6,310,704 | B1 * | 10/2001 | Dogan et al. | 398/9 |
| 6,370,207 | B1 * | 4/2002 | Weill et al. | 375/341 |
| 6,470,047 | B1 * | 10/2002 | Kleinerman et al. | 375/232 |
| 6,483,460 | B2 * | 11/2002 | Stilp et al. | 342/457 |
| 6,492,944 | B1 * | 12/2002 | Stilp | 342/387 |
| 6,535,666 | B1 * | 3/2003 | Dogan et al. | 385/31 |
| 6,611,794 | B1 * | 8/2003 | Fleming-Dahl | 702/191 |
| 6,658,234 | B1 * | 12/2003 | Dogan et al. | 455/63.1 |
| 6,834,109 | B1 * | 12/2004 | Pare et al. | 379/416 |
| 6,876,859 | B2 * | 4/2005 | Anderson et al. | 455/456.1 |

(Continued)

OTHER PUBLICATIONS

Hampshire et al. "Tobit Maximum-Likelihood Estimation for Stochastic Time Series Affected by Receiver Saturation", IEEE 1992.*

(Continued)

*Primary Examiner* — Shambhavi Patel
(74) *Attorney, Agent, or Firm* — Edwards Wildman Palmer LLP; Scott D. Wofsy; Christopher J. Capelli

(57) ABSTRACT

Methods for accurately predicting radio propagation from signal strength measurements. Dynamic range limitations in the measurement data are explicitly taken into account. The resulting propagation models accurately predict signal strength for calculation of coverage and interference.

19 Claims, 5 Drawing Sheets

(56) References Cited

U.S. PATENT DOCUMENTS

| | | | | |
|---|---|---|---|---|
| 6,990,428 | B1* | 1/2006 | Kaiser et al. | 702/150 |
| 7,030,814 | B2* | 4/2006 | Stone et al. | 342/451 |
| 7,088,765 | B1* | 8/2006 | Green et al. | 375/142 |
| 7,173,563 | B2* | 2/2007 | Boonstra et al. | 342/360 |
| 7,236,128 | B2* | 6/2007 | Sugar et al. | 342/465 |
| 7,317,419 | B2* | 1/2008 | Sugar et al. | 342/464 |
| 7,646,830 | B1* | 1/2010 | Weill | 375/341 |
| 8,077,079 | B2* | 12/2011 | Kaiser et al. | 342/174 |
| 8,264,402 | B2* | 9/2012 | Kaiser et al. | 342/174 |
| 2001/0022558 | A1* | 9/2001 | Karr et al. | 342/450 |
| 2002/0172223 | A1* | 11/2002 | Stilp | 370/480 |
| 2003/0063678 | A1* | 4/2003 | Crawford | 375/260 |
| 2003/0146871 | A1* | 8/2003 | Karr et al. | 342/457 |
| 2003/0222819 | A1* | 12/2003 | Karr et al. | 342/457 |
| 2005/0085237 | A1* | 4/2005 | Yang et al. | 455/452.2 |
| 2005/0285793 | A1* | 12/2005 | Sugar et al. | 342/465 |
| 2006/0114147 | A1* | 6/2006 | Boonstra et al. | 342/174 |

OTHER PUBLICATIONS

Roos et al. "A Statistical Modeling Approach to Location Estimation". IEEE Transactions on Mobile Computing, vol. 1, No. 1, Jan.-Mar. 2002.*

Dempster et al. "Maximum Likelihood from Incomplete Data via the EM Algorithm", Journal of the Royal Statistics Society, Series B (Methodological), vol. 39, No. 1 (1977).*

Gunnarsson et al. "Parameter Estimation in Cellular Radio Systems", 1998.*

Viberg et al. "Maximum Likelihood Array Processing in Spatially Correlated Noise Fields Using Parameterized Signals", IEEE Transactions on Signal Processing, vol. 45, No. 4, Apr. 1997.*

Sayed et al. "Network-Based Wireless Location", IEEE Signal Processing Magazine [24] Jul. 2005.*

Chen et al. "Maximum-Likelihood Source Localization and Unknown Sensor Location Estimation for Wideband Signals in the Near-Field", IEEE Transactions on Signal Processing, vol. 50, No. 8, Aug. 2002.*

Salamatian et al. "Hidden Markov Modeling for network communication channels", 2001.*

Richter, Andreas. "Estimation of Radio Channel Parameters: Models and Algorithms", 2005.*

Molisch, Andreas. "Ultrawideband Propagation Channels-Theory, Measurement, and Modeling", IEEE Transactions on Vehicular Technology, vol. 54, No. 5, Sep. 2005.*

Durgin et al. "Measurements and Models for Radio Path Loss and Penetration Loss in and Around Homes and Trees at 5.85 GHz", IEEE Transactions on Communications, vol. 46, No. 11, Nov. 1998.*

Patwari et al. "Relative Location Estimation in Wireless Sensor Networks", IEEE Transactions on Signal Processing, vol. 51, No. 8, Aug. 2003.*

* cited by examiner

METHODS FOR ACCURATE USE OF FINITE DYNAMIC RANGE MEASUREMENT DATA IN RADIO PATH LOSS PROPAGATION MODEL CALIBRATION

CLAIM OF PRIORITY

This application is a continuation of U.S. patent application Ser. No. 13/012,651 entitled "Methods for Accurate Use of Finite Dynamic Range Measurement Data in Radio Path Loss Propagation Model Calibration", by Nathan Hunt et al., filed Jan. 24, 2011, which is a continuation of U.S. patent application Ser. No. 12/633,113 entitled "Methods for Accurate Use of Finite Dynamic Range Measurement Data in Radio Path Loss Propagation Model Calibration", by Nathan Hunt et al., filed Dec. 8, 2009, which is a continuation of U.S. patent application Ser. No. 11/372,154 entitled "Methods for Accurate Use of Finite Dynamic Range Measurement Data in Radio Path Loss Propagation Model Calibration", by Nathan Hunt et al., filed Mar. 9, 2006, which claims priority to U.S. Provisional Patent Application No. 60/661,128 entitled "Methods for Accurate Use of Finite Dynamic Range Measurement Data in Radio Path Loss Propagation Model Calibration", by Nathan Hunt et al., filed Mar. 11, 2005.

COPYRIGHT NOTICE

A portion of the disclosure of this patent document contains material that is subject to copyright protection. The copyright owner has no objection to the facsimile reproduction by anyone of the patent document or the patent disclosure, as it appears in the U.S. Patent and Trademark Office patent file or records, but otherwise reserves all copyright rights whatsoever.

FIELD OF THE INVENTION

This invention relates to the field of calibrating data parameter sets for application to a signal propagation model describing data of limited dynamic range.

BACKGROUND OF THE INVENTION

The effectiveness of predictive design and optimization of cell phone networks depends on the accuracy of predicted radio signal strength over the geographic area where service is to be provided. The prediction is made with a mathematical model called a propagation model. Propagation models typically predict radio signal strength given the transmitting antenna pattern and digital terrain maps and clutter maps, although they may also use additional descriptions of the physical environment such as vector data and building databases. Propagation models have a number of parameters whose values are determined by calibrating the model with measurement data. Once a model is calibrated for a particular geographic area, the required signal strength and interference predictions can be carried out.

Model calibration is required to give specific loss characteristics to the physical environment description. For example, the average properties of clutter categories may vary between markets or be unknown altogether. Model calibration assigns optimal values to each clutter category.

The signal strength measurement data used for model calibration is usually either Continuous Wave (CW) data or scanner data. To collect CW data, a clear frequency is selected and a continuous signal is transmitted at that frequency. Data is collected over a drive route. A receiver set to the transmitting frequency collects the data in conjunction with position information from a GPS receiver.

Scanner data is also collected on a drive with simultaneous collection of GPS data. Scanner data is distinct from CW data in that the actual pilot signals from the network are detected, rather than the separate monotone signal used for CW. Signals can be collected from many sites simultaneously, depending on the scanner configuration.

Model calibration is conventionally carried out by finding the parameter set that gives the minimum least-squares (or OLS, for Ordinary Least Squares) fit to the measurement data. Under certain simple assumptions (i.e. that the errors in the data are normally distributed, and that data is an unbiased sample of the underlying population), the OLS fit is the best prediction that can be made.

All measurement data has a finite dynamic range. This generally introduces bias into the measurement data set. Models created by OLS fit to the data may therefore be biased and will not give the best prediction possible.

The effects of the bias due to finite dynamic range are shown in FIGS. 1 and 2. In FIG. 1, received signal strength is shown as a function of distance, along with a simple linear OLS fit to the data. In FIG. 2, the same data set is shown, this time with signals below −100 dBm excluded. The resulting OLS fit predicts less attenuation with distance than does the fit to the full data set shown in FIG. 1. While the OLS fit in FIG. 2 fully reflects the bias in the measurement data set, the Maximum Likelihood (ML) fit (described below) corrects for this bias and gives results nearly equal to those obtained with the full data set.

The example data in FIGS. 1 and 2 is artificial in that the truncation level was applied to the data set, rather than being an inherent feature of it. In real applications, the truncation level or levels are inherent in the data and must be explicitly included in a ML model, as described below. Additionally, a propagation model is usually more complicated than the simple linear fits shown in FIGS. 1 and 2, and will incorporate diffraction and clutter effects among others, as well as antenna discrimination where appropriate. But the figures serve to illustrate the basic issue of bias introduced by limited dynamic range.

SUMMARY OF THE INVENTION

The invention consists of approaches to calibrating propagation models that removes the bias inherent in using data that is of limited dynamic range. It also covers means of implementing these methods in software.

The invention describes treating two types of measurement data, truncated data and censored data. Truncated data is data where observations outside of given limits are lost. A simple example of truncated data is shown in FIG. 2, where measurements with values below −100 dBm are not present in the data set. Data may be truncated from below, above, or both. The truncation level or levels may also vary across the data set.

Censored data is similar to truncated data, the difference being that the location of the points falling outside the receiver dynamic range is given. For example, in the case of the data in FIG. 2, if additionally the distance to each of the observations falling below −100 dBm were known, these would be called censored observations (or left-censored, since they are below a known value). As is the case with truncated data, data may be censored from above (right censored), from below (left censored), or both, and the censoring levels need not be constant across the data set.

The invention describes how to obtain truncated data and truncation levels from measurement data. It also describes how to obtain censored data, censoring levels, and censored observations from measurement data. It describes how to obtain optimal models for truncated and censored data sets using Maximum Likelihood (ML).

DETAILED DESCRIPTION OF THE INVENTION

Figure 1:
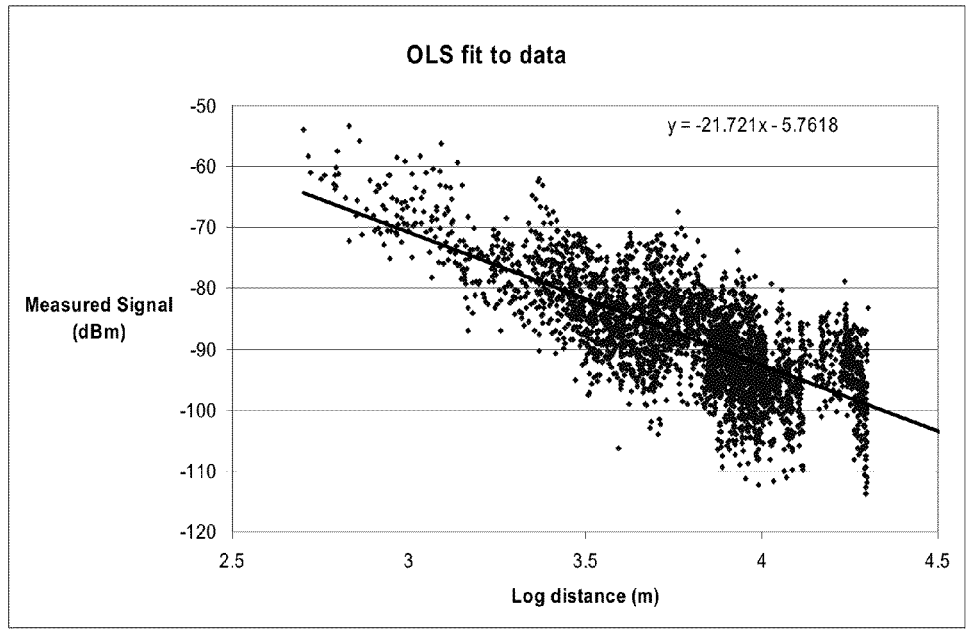
FIG. 1 is a chart measuring signal vs. log of distance with an OLS linear fit.
Figure 2:
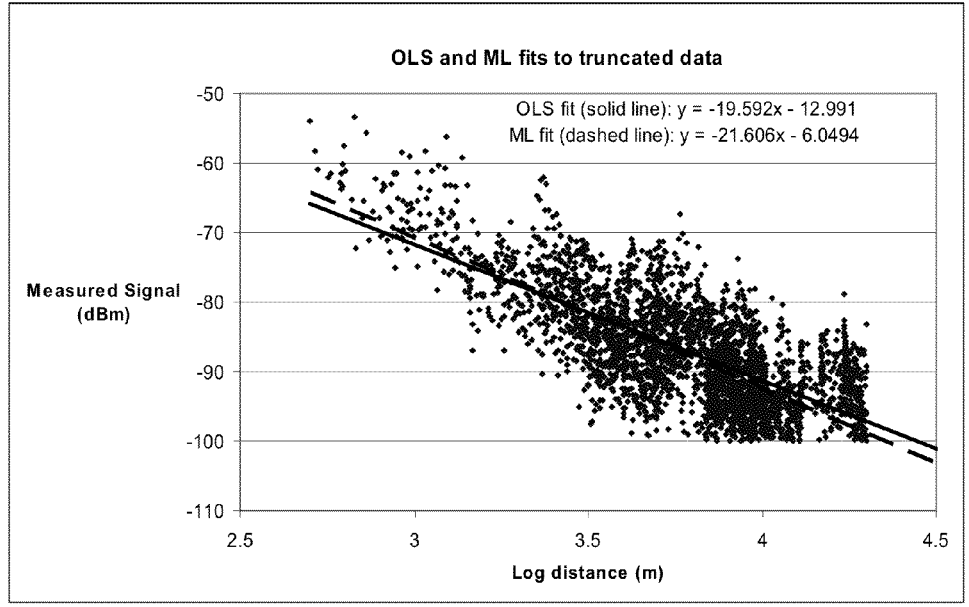
FIG. 2 is a chart measuring signal vs. log of distance, signal level truncated at −100 dBm, with the OLS and truncated ML linear fits to the truncated data. The ML fit corrects for the bias introduced by the truncation, and gives a result quite close to the OLS fit to the full data set shown in FIG. 1.
Figure 3:
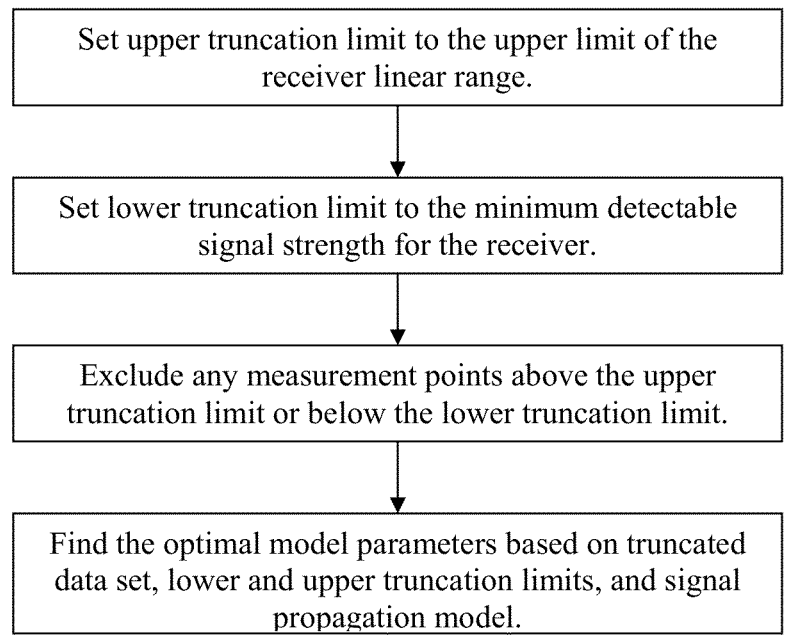
FIG. 3 is a flow diagram for truncated CW data.

CW measurements can be treated as truncated data by using the signal sensitivity threshold as the lower truncation level, and the top end of the receiver linear range as the upper truncation level. Any observations outside these limits are excluded from the data set. FIG. 3 shows a flow diagram of this process.

Figure 4:
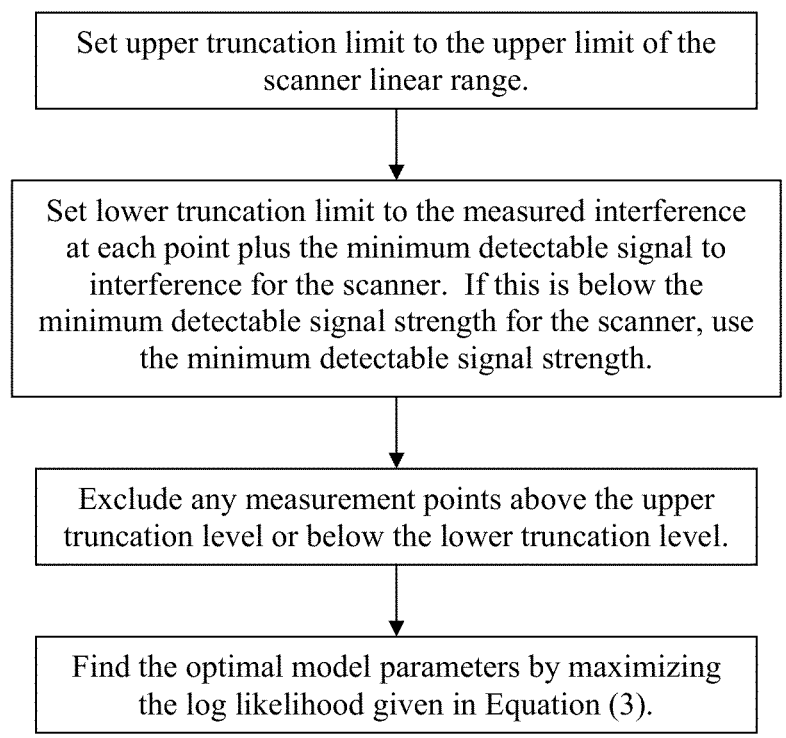
FIG. 4 is a flow diagram for truncated scanner data.

Scanner data can be treated as truncated data by excluding measurements above the linear range or below the receiver sensitivity. The sensitivity limit for scanner data differs from the limit for CW data in that, for scanner data, the sensitivity is often limited by interference. Therefore the lower truncation levels are determined from the interference level measured at each data point. The lower truncation level at a point in the case of CDMA or UMTS is the measured value of $I_0$ (in dBm) at a point plus the minimum $Ec/I_0$ (in dB) that the scanner can reliably measure. For the case of GSM data, the lower truncation level is the measured value of I (in dBm) at a point plus the minimum value of C/I (in dB) that the scanner can reliably measure. FIG. 4 shows a flow diagram of this process.

Given a truncated data set, the optimum or unbiased propagation model is obtained as follows.

To help define notation, we start by giving the formulation for the OLS solution. Vector quantities are shown in bold. The OLS solution is given by finding the vector $\beta$ minimizing the quantity $$\Sigma(y_i - x_i\beta)^2 \quad (1)$$

where the sum is taken over all observations i, $y_i$ is the $i^{th}$ measured value, $x_i$ is a vector of the variables used in the calibration (the dependent variables, such as log distance, diffraction, effective antenna height, clutter terms, etc.), and $\beta$ is a vector of the parameters to be optimized (constant term or intercept, slope, diffraction multiplier, clutter parameters, etc).

The OLS problem can be reformulated as a maximum likelihood (ML) problem, where the log of the likelihood to be maximized is $$L = \Sigma_i \log(2\pi\sigma)^{-1/2} - \Sigma_i (y_i - x_i\beta)^2/(2\sigma^2) \quad (2)$$

where $y_i$, $x_i$ and $\beta$ are as in equation (1) and $\sigma$, an estimate of the dispersion, is an additional model parameter to be optimized along with the components of $\beta$. The maximum likelihood solution of (2) will yield the same solution $\beta$ as (1), with the optimum value of $\sigma$ equal to the standard deviation of the measurements, $y_i$.

The optimum parameter set for the truncated problem is obtained by maximizing the log of the likelihood L, $$L = \Sigma_i \log(2\pi\sigma)^{-1/2} - \Sigma_i(y_i - x_i\beta)^2/(2\sigma^2) - \Sigma_i \log \Phi[(c_i - x_i\beta)/\sigma] - \Sigma_i \log \Phi[(x_i\beta - d_i)/\sigma] \quad (3)$$

where $y_i$, $x_i$, $\sigma$ and a are as in (2), the $c_i$ are the upper truncation values, the $d_i$ are the lower truncation values, and $\Phi$ is the standard normal distribution function.

Censored data can be generated from CW data by using the positions of points where the measurement falls below the sensitivity limit of the receiver (left censored observations) or above the receiver's linear range (right censored observations). Censored data is generated from scanner data in the same way, but the lower limit is usually determined by the measured interference at each point. The lower censoring level at a point in the case of CDMA or UMTS is the measured value of $I_0$ (in dBm) at a point plus the minimum $Ec/I_0$ (in dB) that the scanner can reliably measure. For the case of GSM data, the lower censoring level is the measured value of I (in dBm) at a point plus the minimum value of C/I (in dB) that the scanner can reliably measure.

Figure 5:
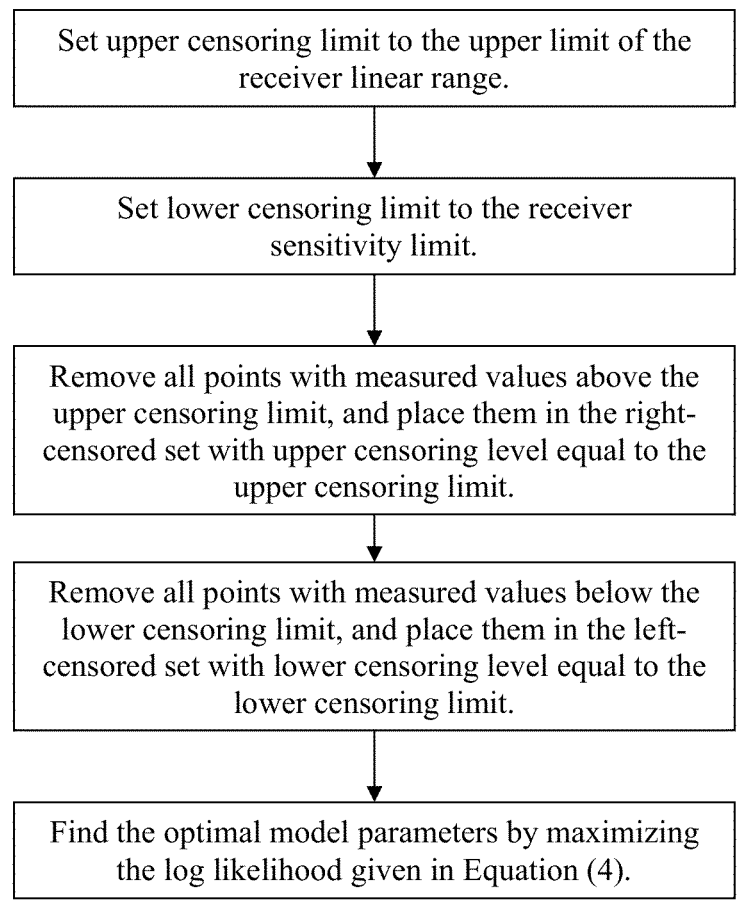
FIG. 5 is a flow diagram for censored CW data.
Figure 6:
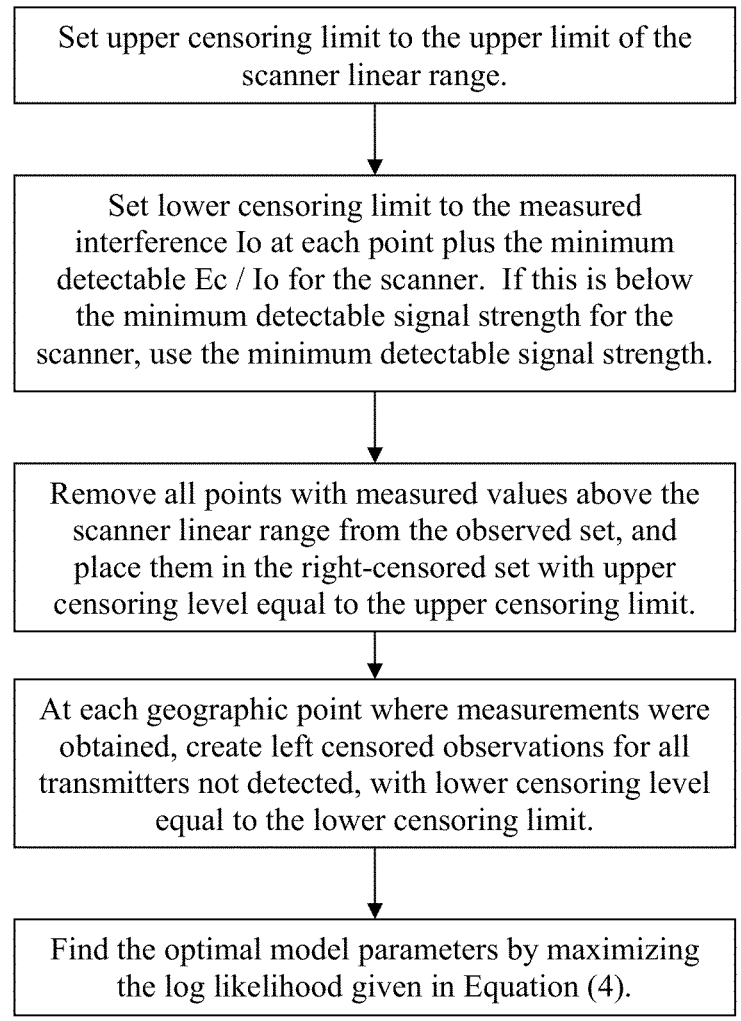
FIG. 6 is a flow diagram for censored scanner data.

FIG. 5 shows a flow diagram of the process for censored CW data, while FIG. 6 shows a flow diagram of the process for censored scanner data.

The optimum parameter set for the censored problem is obtained by maximizing the log of the likelihood, L $$L = \Sigma_i \log(2\pi\sigma)^{-1/2} - \Sigma_i(y_i - x_i\beta)^2/(2\sigma^2) - \Sigma_j \log \Phi[(x_j\beta - c_j)/\sigma] - \Sigma_k \log \Phi[(d_k - x_k\beta)/\sigma] \quad (4)$$

where the summations over i are sums over the uncensored observations, the summations over j are over the right-censored observations, the summations over k are over the left-censored observations, $y_i$, $x_i$, $\beta$ and $\sigma$ are as in (3), $c_j$ and $d_k$ are the upper and lower censoring limits, respectively, and $x_k$ is the vector of dependent variables at the $k^{th}$ censored observation.

What is claimed is:

1. A method of accurately calculating an unbiased parameter set for application to a radio signal propagation model describing data of limited dynamic range, comprising the steps of:
   a) representing a set of N data points of radio signal data collected by a receiver as a truncated data set, wherein said truncated data set is truncated using a set of N lower truncation limits, wherein a lower truncation limit is calculated for each data point according to a sensitivity threshold of the radio signal data determined by said receiver, and wherein said truncated data set is further truncated using an upper truncation limit calculated according to an upper limit of the linear range of said receiver;
   b) excluding from said truncated data set all data outside a range defined by said lower and upper truncation limits; and
   c) based on said truncated data set, based on said lower and upper truncation limits, and based on a radio signal propagation model, calculating an unbiased parameter set maximizing the accuracy with which said radio signal propagation model describes said data set, wherein the method uses a truncated likelihood function that only includes terms involving observed signals and the truncation limits, but no terms corresponding directly to unobserved signals.

2. The method of claim 1, wherein said step of calculating comprises maximizing the likelihood of said signal propagation model to calculate radio path signal loss, given said data, said lower truncation limit, and said upper truncation limit.

3. The method of claim 1, wherein said step of representing comprises representing the signal strength of the radio signal data.

4. The method of claim 1, wherein said step of representing comprises representing the set of N data points as collected by a cellular phone network.

5. The method of claim 4, wherein said step of representing comprises representing the signal strength of the radio signal data.

6. The method of claim 1, wherein said step of calculating is performed using a maximum likelihood (ML) fit.

7. The method of claim 1, wherein an Ordinary Least Squares (OLS) solution is given by finding a vector $\beta$ minimizing a quantity:

$$\Sigma(y_i - x_i \beta)^2 \quad (1)$$

where a sum is taken over all observations i, y, is a $i^{th}$ measured value, x, is a vector of dependent variables used in calibration, and $\beta$ is a vector of parameters to be optimized.

8. The method of claim 7, wherein the dependent variables used in calibration comprise one or more of log distance, diffraction, effective antenna height, and clutter terms.

9. The method of claim 7, wherein the parameters to be optimized comprise one of more of intercept, slope, diffraction multiplier, and clutter parameters.

10. The method of claim 7, wherein the OLS problem is reformulated as a maximum likelihood (ML) problem.

11. The method of claim 10, wherein the log of the likelihood to be maximized is:

$$L = \Sigma_i \log(2\pi\sigma)^{-1/2} - (y_i - x_i\beta)^2/(2\sigma^2) \quad (2)$$

where $\sigma$ is an estimate of the dispersion and is an additional parameter to be optimized.

12. The method of claim 11, wherein the optimized parameters for the truncated problem are obtained by maximizing the log of the likelihood L according to the equation:

$$L = \Sigma_i \log(2\pi\sigma)^{-1/2} - \Sigma_i(y_i - x_i\beta)^2/(2\sigma^2) - \Sigma_i \log \Phi[(c_i - x_i\rho)/\sigma] - \Sigma_i \log \Phi[(x_i\beta - d_i)/\sigma]. \quad (3)$$

13. The method of claim 12, wherein an optimized value of $\sigma$ is approximately equal to a standard deviation of the measured values $y_i$.

14. The method of claim 4, wherein the cellular phone network is a Code Division Multiple Access (CDMA) network.

15. The method of claim 14, wherein the lower truncation limit is a measured value of $I_o$, in decibels of power referenced to one milliwatt plus a minimum value of $Ec/I_o$ in decibels that the receiver can reliably measure.

16. The method of claim 4, wherein the cellular phone network is a Universal Mobile Telecommunications System (UMTS) network.

17. The method of claim 16, wherein the lower truncation limit is a measured value of $I_0$, in decibels of power referenced to one milliwatt plus a minimum value of $Ec/I_0$ in decibels that the receiver can reliably measure.

18. The method of claim 4, wherein the cellular phone network is a Global Standard for Mobile Communications (GSM) network.

19. The method of claim 18, wherein the lower truncation limit is a measured value of I, in decibels of power referenced to one milliwatt plus a minimum value of C/I in decibels that the receiver can reliably measure.

* * * * *

UNITED STATES PATENT AND TRADEMARK OFFICE
CERTIFICATE OF CORRECTION

PATENT NO. : 8,738,337 B2
APPLICATION NO. : 13/564991
DATED : May 27, 2014
INVENTOR(S) : Nathan Hunt et al.

Page 1 of 1

It is certified that error appears in the above-identified patent and that said Letters Patent is hereby corrected as shown below:

In the Claims

At column 5, claim number 7, line number 22, change "y" to --$y_i$--

At column 5, claim number 7, line number 23, change "x" to --$x_i$--

At column 6, claim number 11, line number 3, change

"$L = \Sigma_i \log (2\pi\sigma)^{-1/2} - (y_i - x_i\beta)^2 / (2\sigma^2)$" to
--$L = \Sigma_i \log (2\pi\sigma)^{-1/2} - \Sigma_i (y_i - x_i\beta)^2 / (2\sigma^2)$--

Signed and Sealed this
Ninth Day of September, 2014

Michelle K. Lee
*Deputy Director of the United States Patent and Trademark Office*